April 17, 1962 R. S. C. COBBOLD 3,030,525

CURRENT SWITCH COMPRISING COMPLEMENTARY TRANSISTORS

Filed Sept. 18, 1959

INVENTOR
RICHARD S. C. COBBOLD

By Smart & Biggar
ATTORNEYS

United States Patent Office 3,030,525

Patented Apr. 17, 1962

3,030,525

CURRENT SWITCH COMPRISING COMPLEMENTARY TRANSISTORS

Richard S. C. Cobbold, Kirk's Ferry, Quebec, Canada, assignor to Her Majesty the Queen in right of Canada as represented by the Minister of National Defence Filed Sept. 18, 1959, Ser. No. 840,908

2 Claims. (Cl. 307—88.5)

The present invention relates to a transistor switching circuit.

There are many instances, particularly in digital computers, where the flow of current through a load must be switched on and off in dependence on an external signal. The apparatus used to switch the current on and off must dissipate a minimum of power and the power loss in the switch due to the current being controlled should be small compared with the power dissipated in the load. A transistor operated in the saturated mode is capable of providing an impedance between its collector and its emitter normally less than an ohm. Additionally the power dissipated in such a transistor may be small enough to enable the use of a lower power dissipation transistor to control a relatively large flow of current.

According to the present invention, a transistor circuit for controlling the flow of current through a load comprises a first transistor having an emitter, a base and a collector, and a complementary second transistor having an emitter, a base and a collector. The collector of the first transistor is connected to the load, the emitter of the first transistor is connected to a first source of positive potential, and the base of the first transistor is connected to the collector of said second transistor. A diode is connected between the base and emitter of the first transistor and is adapted to conduct current from the base to said emitter. A second source of positive voltage is connected to the collector of the second transistor by a first resistor, the emitter of the second transistor is connected to a third source of positive potential by a second resistor and the base of the second transistor is connected to an input terminal. The second source is positive with respect to the first source and the first source is positive with respect to the third source. An input voltage at the input terminal more positive than the third voltage causes the circuit to permit current to flow through the load, and an input voltage at the input terminal negative with respect to the voltage of the third source causes the circuit substantial to stop the flow of current through the load.

Figure 1:
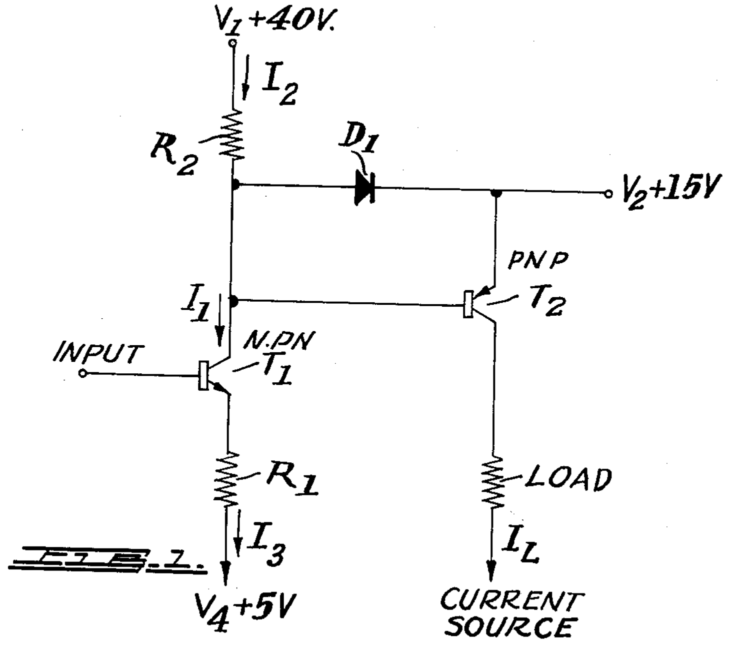
Figure 2:
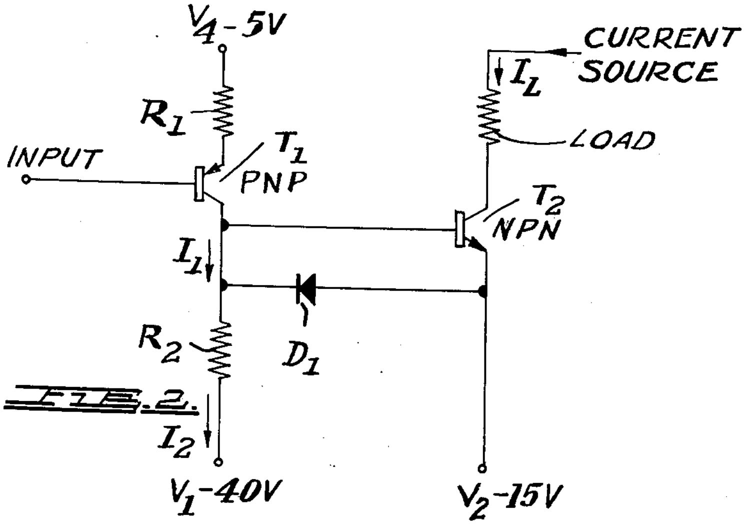

In drawings which illustrate embodiments of the invention:

FIGURE 1 shows an embodiment which is capable of handling currents up to 500 ma. and having an impedance of less than one-half ohm, using transistors which are currently available; and FIGURE 2 is a schematic diagram of the complementary circuit of FIGURE 1.

In FIGURE 1 a transistor $T_2$ has a load connected between its collector and a source of current. The emitter of transistor $T_2$ is connected to a source of voltage $V_2$ having a nominal value of +15 volts. The base of the transistor $T_2$ is connected to the collector of transistor $T_1$ and a diode $D_1$ is connected between the base and emitter of transistor $T_2$ in a direction to conduct current from the base to emitter of transistor $T_2$. The base of transistor $T_2$ is also connected to a second voltage source $V_1$ having a nominal value of +40 volts through a resistor $R_2$. The transistor $T_1$ has its base connected to an input terminal, its emitter connected to a source of voltage $V_4$ having a nominal value of 5 volts positive through a resistor $R_1$ and its collector connected to the base of transistor $T_2$. The input provided to the input terminal is a voltage pulse having a maximum value of 10 volts positive and a minimum value of 0 volt.

When the base of the transistor $T_1$ is at +10 volts, a current $I_1$ flows into the collector. As the transistor $T_1$ is prevented from saturating by the low impedance path through the base of the transistor $T_2$, the collector current is defined by the potential difference between the base of the transistor $T_1$ and $V_4$, the emitter resistance $R_1$, and the common base gain of the transistor $T_1$. A current of $(I_1-I_2)$ will flow out of the base of the transistor $T_2$, and if this is greater than $$\frac{I_L}{\beta_2}$$

the transistor $T_2$ will always remain in the saturated state. The base current of the transistor $T_2$, i.e. $I_{b2}$, provided $T_1$ is conducting, will flow independent of the load current $I_L$, so that the maximum charge storage in the base of the transistor $T_2$ will be given by:

$$Q=(I_1-I_2)\, B_2\, \tau_N$$

where $\tau_N$ is the normal time constant of transistor $T_2$.

If the base of transistor $T_1$ is reduced to some potential negative with respect to that of $V_4$, the transistor $T_1$ will become cutoff, allowing the current $I_2$ to remove some of the excess base charge from the transistor $T_2$. As a rough approximation the transistor $T_2$ will become cut-off after a time $$t=\frac{\tau_N B_2(I_1-I_2)}{I_2}$$

provided that the natural life-time of minority carriers in the base region is long compared to "$t$." If this condition is not met then "$t$" will be shorter than that given by the above equation.

After the majority of the excess charge has been eliminated from the transistor $T_2$, the base will rise to a potential determined by the voltage drop across the diode $D_1$. In the "off" state the impedance of the circuit will be determined by the collector leakage current $I_{co}$, of the transistor $T_2$ which is usually in the order of a few microamperes. Thus the ratio of the impedances in the "off" and "on" states may be in the order of $10^6$.

If the current source is continuous then care must be taken to ensure that the power dissipated in the switch during the transition from one state to the other is not excessive. This problem does not arise if the current source is switched on after setting the switch to either one state or the other.

Typical values for a circuit constructed in accordance with FIGURE 1 are as follows.

Typical values:

$R_1$=680Ω, $T_1$–GT 358, $T_2$–GT 317
$I_2$=4 ma.
$I_3$=15 ma.
$I_L$=400 ma.

Performance:

| | |
|---|---|
| Turn-on | 0.2μs. |
| Turn-off | 0.8μs. |

In FIGURE 2 the complementary circuit to the circuit of FIGURE 1 is shown. A.P.N.P. transistor is substituted for the N.P.N. transistor and an N.P.N. transistor substituted for the P.N.P. transistor. All voltages are negative and the input varies between 0 and −10 volts rather than +10 and 0 volts. In other respects, the circuit is identical to the circuit of FIGURE 1.

What I claim as my invention is:

1. A switching circuit for switching on or off the flow of current through a load comprising a PNP first transistor having an emitter, a base and a collector, and a complementary NPN second transistor having an emitter a base and a collector; the collector of said first transistor being connected to the load, the emitter of said first transistor being connected to a first source of positive potential, the base of said first transistor being connected direct to the collector of said second transistor; a second source of positive potential being connected to the collector of said second transistor by a first resistor, the emitter of said second transistor being connected to a third source of positive potential by a second resistor and the base of said second transistor being connected to an input terminal, said second source being positive with respect to said first source and said first source being positive with respect to said third source; a diode connected from the emitter of the first transistor to said second source and adapted to conduct current from said second source to said first source when said second transistor is cut-off; whereby an input voltage at said input terminal more positive than said third potential causes said circuit to permit current to flow through said load with said first transistor in saturated state and an input voltage at said input terminal negative with respect to the voltage of said third source causes said circuit substantially to stop the flow of current through said load.

2. A switching circuit for switching on or off the flow of current through a load comprising an NPN first transistor having an emitter, a base, and a collector, and a complementary PNP second transistor having an emitter, a base and a collector; the collector of said first transistor being connected to the load, the emitter of said first transistor being connected to a first source of negative potential; the base of said first transistor being connected direct to the collector of said second transistor; a second source of negative potential being connected to the collector of said second transistor by a first resistor, the emitter of said second transistor being connected to a third source of negative potential by a second resistor and the base of said second transistor being connected to an input terminal; said first source being less negative than said second source and said third source being less negative than said first source; a diode connected from the emitter of the first transistor to said first source and adapted to conduct current from said first source to said second source when said second transistor is cut-off whereby an input voltage at said input terminal more negative than said third potential causes said circuit to permit current to flow through said load with said first transistor in saturated state and an input voltage at said input terminal positive with respect to the voltage of said third source causes said circuit substantially to stop flow of current through said load.

References Cited in the file of this patent

UNITED STATES PATENTS

| | | |
|---|---|---|
| 2,770,732 | Chong | Nov. 13, 1956 |
| 2,873,389 | Cagle et al. | Feb. 10, 1959 |